United States Patent
Sato et al.

(10) Patent No.: US 7,648,887 B2
(45) Date of Patent: Jan. 19, 2010

(54) CLASSIFICATION APPARATUS FOR SEMICONDUCTOR SUBSTRATE, CLASSIFICATION METHOD OF SEMICONDUCTOR SUBSTRATE, AND MANUFACTURING METHOD OF SEMICONDUCTOR DEVICE

(75) Inventors: Toshiya Sato, Kawasaki (JP); Katsuto Tanahashi, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 405 days.

(21) Appl. No.: 11/584,607

(22) Filed: Oct. 23, 2006

(65) Prior Publication Data
US 2007/0231934 A1    Oct. 4, 2007

(30) Foreign Application Priority Data
Mar. 28, 2006  (JP)  ............................. 2006-089311

(51) Int. Cl.
*H01L 21/30* (2006.01)
(52) U.S. Cl. ........................... 438/457; 438/14; 438/16; 438/459
(58) Field of Classification Search ................. 438/457, 438/459, 14, 16, 17
See application file for complete search history.

(56) References Cited

U.S. PATENT DOCUMENTS

| 5,376,890 A | * | 12/1994 | Keevil et al. ................. 324/688 |
| 6,107,114 A | * | 8/2000 | Moore ........................... 438/48 |
| 2005/0093101 A1 | * | 5/2005 | Matsumoto ................... 257/617 |

FOREIGN PATENT DOCUMENTS

| JP | 2001-156152 A | 6/2001 |
| JP | 2001-297957 A | 10/2001 |

* cited by examiner

*Primary Examiner*—Kevin M Picardat
(74) *Attorney, Agent, or Firm*—Fujitsu Patent Center

(57) ABSTRACT

A classification apparatus for the semiconductor substrate is provided with a bow measuring section which accepts silicon substrates and measures respective bows thereof. The classification apparatus is also provided with a bow judging section which, based on one or more standard value(s) set in advance, checks a measurement result by the bow measuring section against the standard value(s). The bow judging section judges to which of ranges defined based on the standard value(s) of the bow the measurement result by the bow measuring section belongs. Further, the classification apparatus is provided with a sorting section which accepts the silicon substrate having been measured by the bow measuring section and sorts the accepted silicon substrates based on the judgment results by the bow judging section. In other words, silicon substrates are grouped according to the bows by the sorting section. Then, respective silicon substrates are discharged in a grouped state.

14 Claims, 5 Drawing Sheets

CLASSIFICATION APPARATUS FOR SEMICONDUCTOR SUBSTRATE, CLASSIFICATION METHOD OF SEMICONDUCTOR SUBSTRATE, AND MANUFACTURING METHOD OF SEMICONDUCTOR DEVICE

CROSS-REFERENCE TO RELATED APPLICATIONS

This application is based upon and claims the benefit of priority from the prior Japanese Patent Application No. 2006-089311, filed on Mar. 28, 2006, the entire contents of which are incorporated herein by reference.

BACKGROUND OF THE INVENTION

1. Field of the Invention

The present invention relates to a classification apparatus for a semiconductor substrate, a classification method of a semiconductor substrate, and a manufacturing method of a semiconductor device suitable for enhancing in-plane uniformity of dry etching.

2. Description of the Related Art

A silicon substrate is made by slicing a single crystal ingot formed by a Czochralski (CZ) method, for example. In the CZ method, oxygen leaking out from a crucible is inevitably mixed at a stage of growth of the crystal. Oxygen in silicon fixes dislocation and increases strength. Additionally, when manufacturing a semiconductor device with using this substrate, oxygen supersaturated at the time of heat treatment in process aggregates to generate precipitate. Oxygen precipitate has a function called gettering, in which oxygen captures a heavy metal atom which is mixed from the outside. As described above, in the silicon substrate made by the CZ method, oxygen which leads to improvement of a yield and characteristic of the device is included, and the method has been widely used since a long time ago.

However, in a crystal grown by the CZ method, there may exist a void defect being an aggregate of atomic vacancies in a crystal growth stage, and when the void defect appears on a surface of the silicon substrate, the void defect may be a crucial defect in an operation of a semiconductor device.

Thus, a method is developed for eliminating the void defect on the surface by means of carrying out annealing to the silicon substrate at a high temperature. In this method, it is utilized that a hole is diffused outward at the time of high-temperature annealing. A substrate made by this method is called an annealed substrate. The annealed substrate is being widely used as a substrate for an advanced device.

The substrates for the advanced device include a substrate called an epitaxial substrate, in addition to the annealed substrate. The epitaxial substrate is a substrate in which a silicon thin film is epitaxially grown on a silicon substrate made by the CZ method. Even if the void defect exists on a surface of the substrate made by the CZ method, a silicon atom at the time of epitaxial growth is filled in the void defect. Therefore, the void defect is eliminated also in the epitaxial substrate.

As described above, primarily three kinds of substrate exist as the silicon substrates.

Additionally, when manufacturing a semiconductor device by using such a silicon substrate, a semiconductor film, an insulating film and a conductive film are formed, and these films are processed. Processing methods of these films are classified primarily into dry etching and wet etching.

However, recently, variation increasingly occurs in etching speed even in the same substrate at the time of dry etching. In other words, though etching conditions such as a pressure in a chamber and an applied voltage are the same, there occurs variation in etching speed. Along with the variation of the etching speeds, variation occurs in line width of the formed pattern. As a consequence, variation occurs in characteristic among semiconductor devices manufactured from the same substrate. For example, threshold voltages of transistors may vary by variation of gate widths. However, a cause of the variation has not been revealed yet.

Related arts are disclosed in Japanese Patent Application Laid-open No. 2001-156152, and Japanese Patent Application Laid-open No. 2001-297957.

SUMMARY OF THE INVENTION

An object of the present invention is to provide a classification apparatus for a semiconductor substrate, a classification method of a semiconductor substrate, and a manufacturing method of a semiconductor device capable of restraining variation of states of progress of dry etching.

As a result of keen study to probe a cause of variety of etching speed, the present inventors have found that there are silicon substrates in which threshold voltages of transistors tend to vary according to a value of a bow (JIS H 0611:1994) being one of parameters showing a shape of a silicon substrate.

Here, a content of an experiment which the present inventors carried out will be described. In this experiment, as shown in Table 1, five silicon substrates A, B, C, D and E were prepared which were different in value of the bow.

TABLE 1

| Silicon substrate | Bow (μm) |
| --- | --- |
| A | −2.9 |
| B | −2.2 |
| C | −4.5 |
| D | +0.5 |
| E | +1.3 |

As shown in Table 1, in the silicon substrates A, B and C, the bows are negative, and this indicates that the silicon substrates A, B and C curve in a recessed manner (in a bowl shape, or projecting downward). On the other hand, in the silicon substrates D and E, the bows are positive, and this indicates that the silicon substrates D and E curve in a projecting manner (in a mound shape, or projecting upward). Incidentally, when absolute values of the bows of the respective silicon substrates are compared, the bows of the silicon substrates D and E are low, and so these two silicon substrates in particular are conventionally regarded as good substrates.

In this experiment, processes such as dry etching were performed under the same conditions except the differences in shape of the substrate as shown in Table 1, to form transistors in the silicon substrates A to E, respectively. Here, the condition of dry etching was the condition which was considered suitable for the processing the silicon substrate A from experience. Threshold voltages of a plurality of transistors formed in the respective silicon substrates were measured. A result thereof is shown in FIG. 1.

As shown in FIG. 1, equivalent threshold voltages to each other were obtained in the silicon substrates A to C, while threshold voltages in the silicon substrates D and E were apparently lower than the threshold voltages of the silicon substrates A to C. In other words, when dry etching was carried out under the condition favorable to the silicon substrate A, stable threshold voltages were obtained in the silicon substrates B and C whose bows were negative (in a recessed manner) as in the silicon substrate A, but satisfactory threshold voltages were not obtained in the silicon substrates D and E whose bows were positive (in a projecting manner), though the absolute values of the bows were low.

Further, the present inventors formed a plurality of transistors on a surface of another silicon substrate whose bow was positive (mound shape), measured gate widths thereof, and investigated a distribution of the gate widths whose differences from a design value exceeded a tolerance range. As a consequence, as shown in FIG. 2, defect regions 32 in which transistors whose gate width differences were large concentrate were positioned in an outer peripheral portion of the silicon substrate 31. As described above, defects did not occur on the entire surface of the silicon substrate 1. From this result, it is considered that cooling at the time of dry etching is not carried out uniformly. Incidentally, a vertical axis in FIG. 1 indicates a threshold voltage at the time of an USL (Upper Spec Limit) of a threshold voltage of an N channel transistor being "1".

Additionally, based on these information and study result, the present inventors have conceived modes of the invention described below.

A classification apparatus for a semiconductor substrate according to the present invention is provided with: a bow measurer measuring bows of semiconductor substrates; and a sorter sorting the semiconductor substrates by checking the bows of the semiconductor substrates against a standard set in advance.

In a classification method of a semiconductor substrate according to the present invention, bows of semiconductor substrates are measured, then, the semiconductor substrates are sorted by checking the bows of the semiconductor substrates against a standard set in advance.

In a manufacturing method of a semiconductor device according to the present invention, a bow of a semiconductor substrate is recognized, then, an etching condition corresponding to the bow of the semiconductor substrate is acquired from etching conditions set in advance according to each bow. Then, dry-etching of the semiconductor substrate is performed under the acquired etching condition.

Here, a concept of a semiconductor substrate includes not only a semiconductor substrate itself but also a film formed thereon. In other words, not only a processing of the semiconductor substrate, but also processings of a semiconductor film, an insulating film, a conductive film and the like formed thereon are included in objects of dry etching.

DETAILED DESCRIPTION OF THE PREFERRED EMBODIMENTS

Hereinafter, embodiments of the present invention will be described concretely with reference to the attached drawings.

First Embodiment

Figure 1:
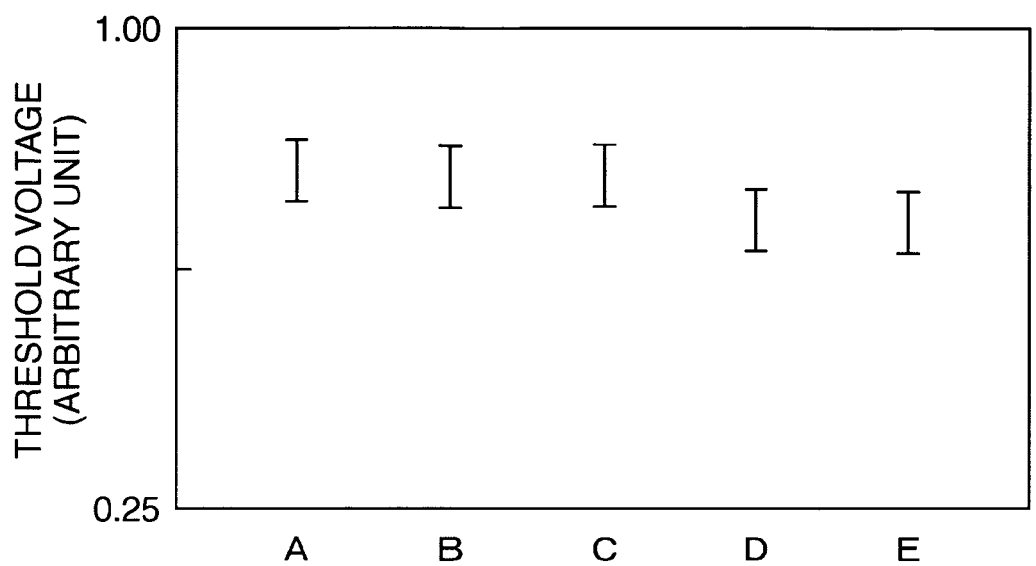
FIG. 1 is a graph showing a measurement result of a threshold voltage of a transistor.
Figure 2:
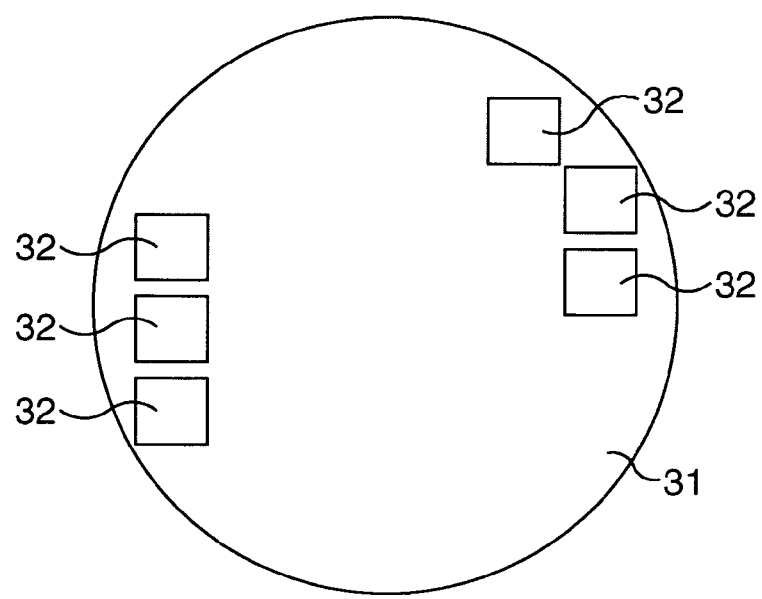
FIG. 2 is a view showing regions in which defects occur.
Figure 3:
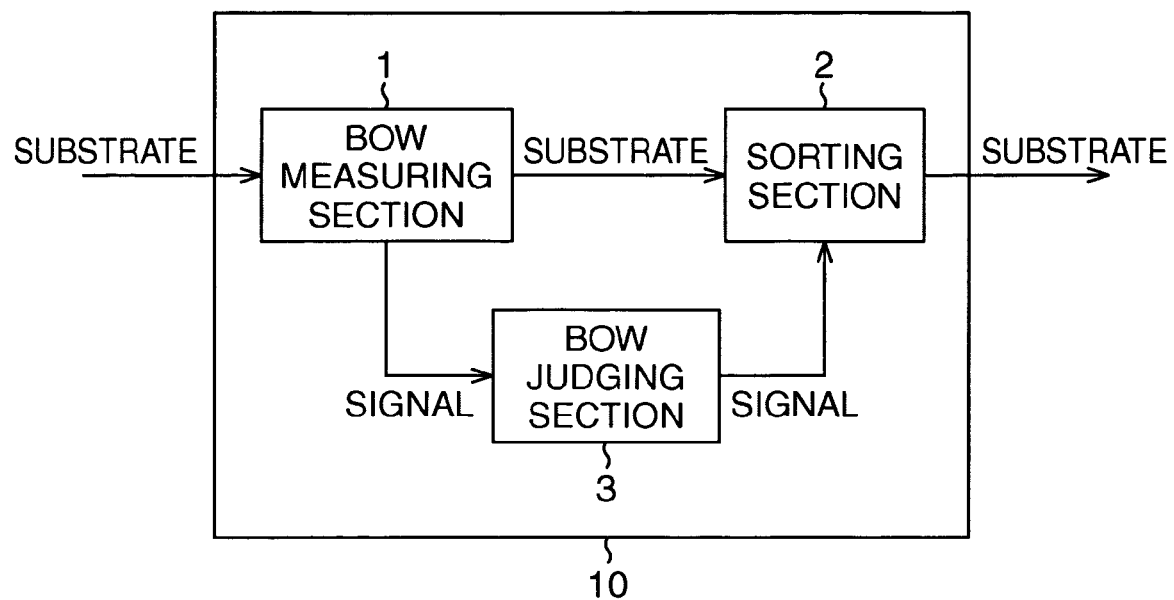
FIG. 3 is a block diagram showing a classification apparatus for a semiconductor substrate according to a first embodiment of the present invention.

First, a classification apparatus for a semiconductor device according to a first embodiment of the present invention will be described. FIG. 3 is a block diagram showing a classification apparatus for a semiconductor substrate according to the first embodiment of the present invention.

A classification apparatus 10 for a semiconductor substrate according to the first embodiment is provided with a bow measuring section 1 which accepts silicon substrates and measures respective bows thereof. The classification apparatus 10 for the semiconductor substrate is also provided with a bow judging section 3 which, based on one or more standard value(s) of the bow set in advance, checks a measurement result by the bow measuring section 1 against the standard value(s). The bow judging section 3 judges to which of a plurality of ranges defined based on the standard value(s) of the bow the measurement result by the bow measuring section 1 belongs. Further, the present embodiment is provided with a sorting section 2 which accepts the silicon substrates having been measured by the bow measuring section 1 and sorts the accepted silicon substrates based on the judgment results by the bow judging section 3. In other words, the silicon substrates are grouped according to the bows thereof by the sorting section 2. Then, respective silicon substrates are discharged in a grouped state.

The standard value used by the bow judging section 3 is not specifically limited, and "0" (zero) is used, for example. In this case, the bow judging section 3 uses two kinds of ranges (a range of "0" or more, and a negative range) as the ranges of the bow, and is to judge whether the measurement result by the bow measuring section 1 is "0" or more, or negative.

According to the first embodiment as above, the silicon substrate is discharged in a state in which sorting based on the range of the bow is carried out, so that it is possible to easily determine a dry etching condition under which variety or the like of the line width is hard to occur at the time of manufacturing the semiconductor device by using such a silicon substrate. Therefore, it is possible to easily improve a yield.

Second Embodiment

Figure 4:
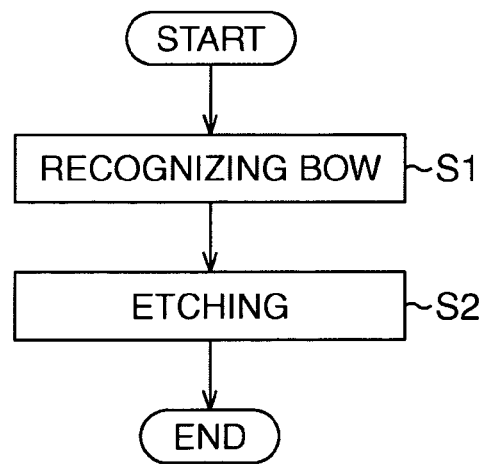
FIG. 4 is a flowchart showing a manufacturing method of a semiconductor device according to a second embodiment of the present invention.

Next, a manufacturing method of a semiconductor device according to a second embodiment of the present invention will be described. FIG. 4 is a flowchart showing the manufacturing method of the semiconductor device according to the second embodiment of the present invention.

In the second embodiment, as in a conventional method, a semiconductor film, an insulating film, a conductive film and the like are formed on a silicon substrate, and then these films are processed. It should be noted that processes shown in FIG. 4 are performed when dray etching is carried out to process these films.

In other words, first, in a step S1, a bow of the silicon substrate on which the film to be processed is formed is recognized (acquired). The bow may be measured on site, or measured during the time from manufacturing of the silicon substrate to first formation of the film, and the measurement result may be always attached at the time of conveying and the like of the silicon substrate as one of information of the silicon substrate. Also, a plurality of semiconductor substrates may be accepted and the bows thereof may be measured, so that sorting may be carried out based on the result as in the first embodiment. In this case, the standard value at the time of sorting or the like can be used. Incidentally, a precise value of the bow is not necessarily required but it is enough that a certain range is recognized. For example, it is enough that it is recognized whether the bow is "0" or more, or negative. If the silicon substrate is the one sorted by the classification apparatus according to the first embodiment, the information at the time of sorting can be used.

Next, in a step S2, dry etching is carried out after a condition is set according to the range of the bow recognized in the step S1. Preferably, the etching condition is examined in advance according to the range of the bow and stored in a database or the like. Incidentally, if silicon substrates in the group sorted by the first embodiment are processed consecutively, the etching condition is not required to be altered.

In a semiconductor substrate (wafer) whose bow is "0" or more (projecting upward) at the time of etching, adhesion strength of an electrostatic chuck tends to be low in a center portion. Thus, a temperature of the center portion of the semiconductor substrate is easy to rise, and a pattern tends to be narrower in that portion. Therefore, when etching is carried out to the semiconductor substrate whose bow is "0" or more, it is preferable that the processing is carried out with a recipe in which a gas-cooling-pressure at the center portion is made high so that the temperature of the center portion does not rise excessively. Incidentally, it is possible to control the gas cooling pressures to the center portion and an outer peripheral portion of the semiconductor substrate independently, also in a conventional etching device.

On the other hand, in a semiconductor substrate whose bow is less than "0", adhesion strength of an electrostatic chuck tends to be low in the outer peripheral portion. Thus, a temperature of an edge portion of the semiconductor substrate is easy to rise, and a pattern tends to be narrower in that portion. Therefore, when etching is carried out to the semiconductor substrate whose bow is less than "0", it is preferable that the processing is carried out with a recipe in which a-gas-cooling pressure at the outer peripheral portion is made high so that the temperature of the outer peripheral portion does not rise excessively.

Figure 5:
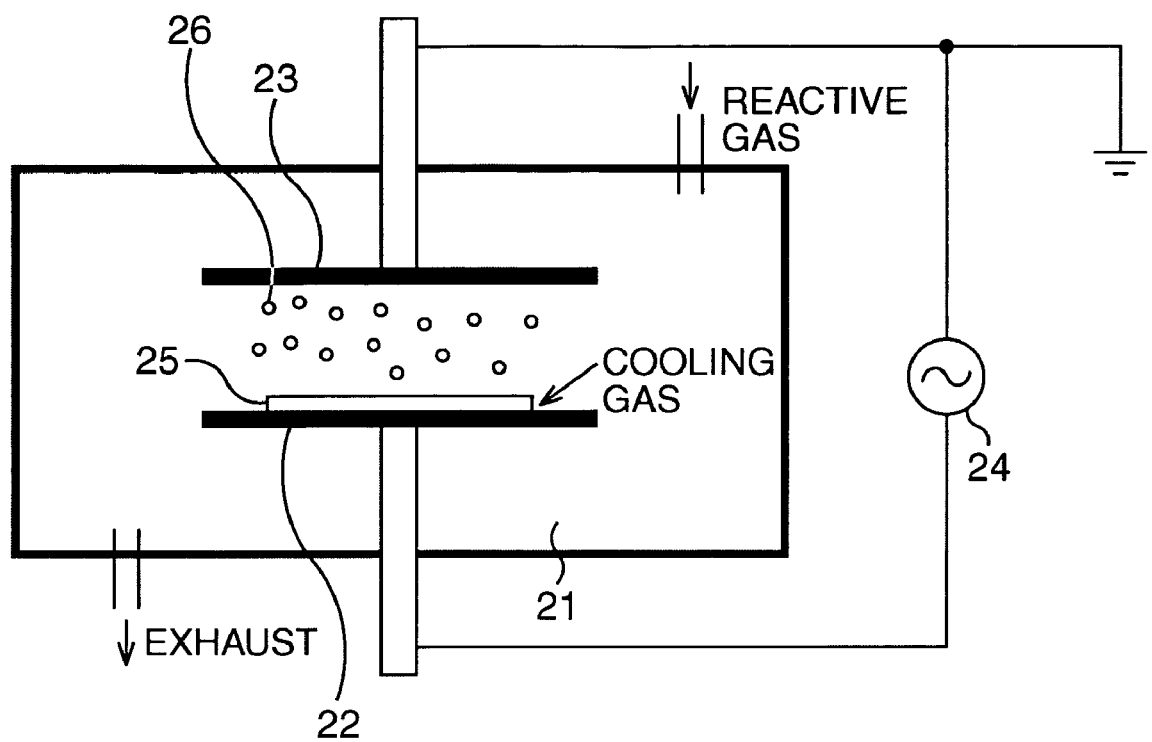
FIG. 5 is a view showing an example of a dry etching apparatus.

Here, a reactive ion etching (RIE) apparatus being an example of the dry etching apparatus will be described. FIG. 5 is a view showing an example of the RIE apparatus. In this RIE apparatus, two electrodes 22 and 23 are disposed parallel to each other in a chamber 21. The electrodes 22 and 23 are connected to an AC power source (high frequency power source) 24 provided in the outside of the chamber 21. Additionally, on the electrode 22 positioned at a lower side, a substrate 25 is fixed via an electrostatic chuck (not shown). Cooling gas flows between the substrate 25 and the electrode 22.

When dry etching is carried out, first, a vacuum state is created inside the chamber 21, and then reactive gas is supplied in the chamber 21 to maintain a pressure inside the chamber 21 at a desired pressure. Next, a high frequency signal is applied from the high frequency power source 24 to the electrodes 22 and 23. As a consequence, plasma 26 occurs between the electrodes 22 and 23. Then, a gas molecule in the plasma 26 inelastically collides with an electron and is dissociated or ionized, to become an atom or a molecule which is chemically active. Subsequently, ions (active atom and active molecule) are accelerated by an electric field between the electrodes 22 and 23 and collide with a surface of the substrate 25. As a consequence, on a surface of a film (object to be processed) formed on the substrate surface, physical sputtering by ion collision proceeds and etching by desorption of a chemical compound generated by chemical reaction between the object to be processed and the ions proceeds.

It should be noted that the surface of the substrate 25 is exposed to high-density plasma and a temperature of the substrate 25 rises during ion dry etching. Thus, in order to keep the etching condition, cooling gas, for example, inert gas is flown between the substrate 25 and the electrode 22.

In such a dry etching device, routes of the cooling gas are different according to the bows, and so the temperature of the substrates 25 may fluctuate even if the etching conditions are the same. In contrast, in the second embodiment, since etching is carried out under the condition set in advance according to the range of the bow, variety of the etching speed and variety of the line width associated therewith are restrained. As a consequence, characteristics of each semiconductor element, for example, a threshold voltage of a transistor is stabilized.

Next, a series of processings to which the second embodiment is applied will be described. FIG. 6A to FIG. 6E are cross-sectional views showing, step by step, a series of processings to which the second embodiment of the present invention is applied.

Figure 6A:
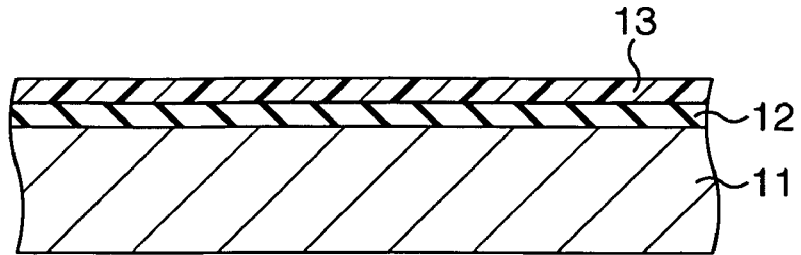
FIG. 6A to FIG. 6E are cross-sectional views showing, step by step, processes to which the second embodiment of the present invention is applied.

First, as shown in FIG. 6A, a silicon oxide film 12 is formed on a silicon substrate 11, and a photoresist film 13 is formed thereon. Here, a negative type photoresist film is used as the photoresist film 13.

Figure 6B:
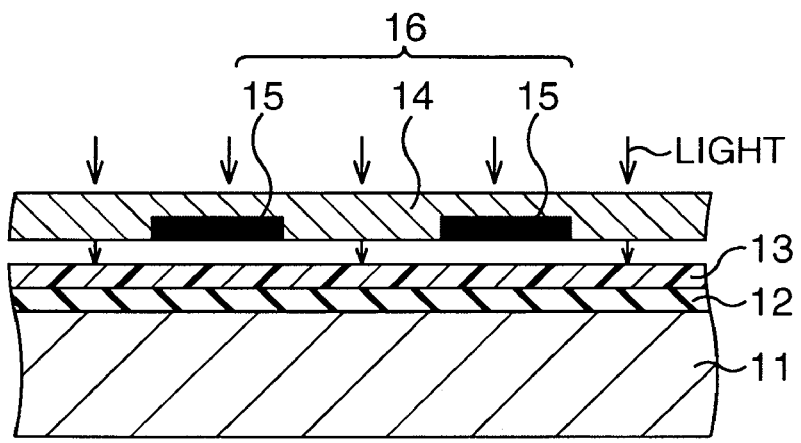

Next, as shown in FIG. 6B, light is irradiated to the photoresist film 13 from thereabove via a mask 16 having transmission portions 14 and light shield portions 15. In other words, exposure is carried out. As a consequence, the light transmitted through the transmission portions 14 reaches the photoresist film 13, so that only those portions are exposed.

Figure 6C:
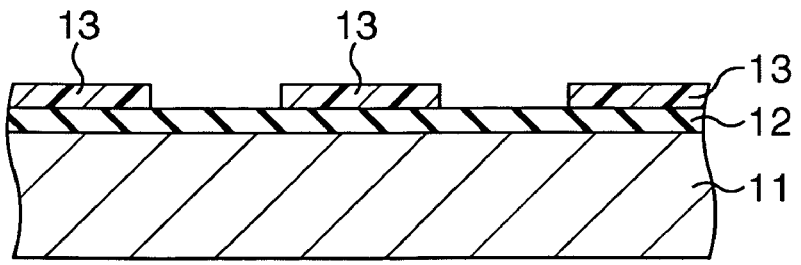

Next, as shown in FIG. 6C, the photoresist film 13 is developed. As a consequence, only the portions which are exposed remain and portions which are not exposed are removed. Incidentally, if a positive type photoresist film is used as the photoresist film 13, only the portions which are not exposed remain.

Figure 6D:
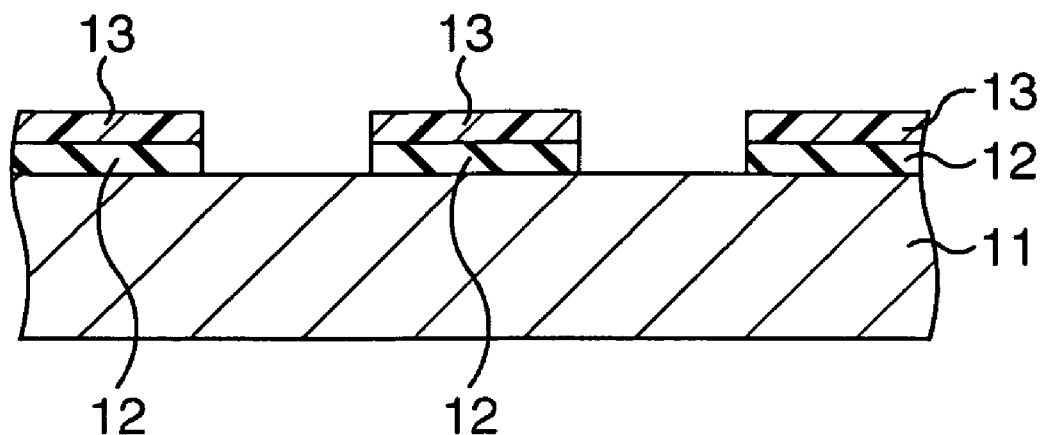
Figure 6E:
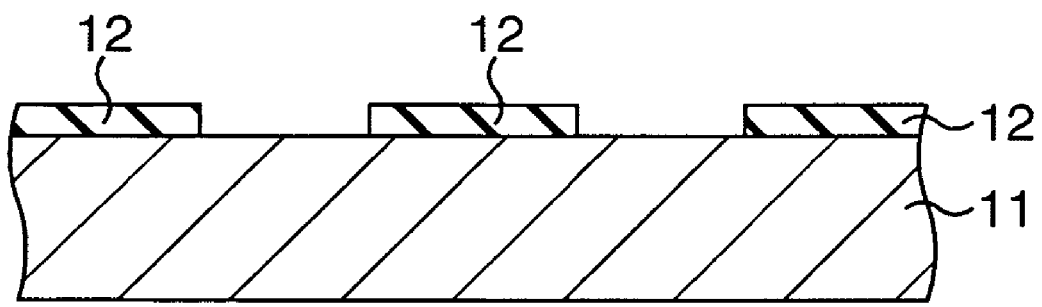

Subsequently, as shown in FIG. 6D, with the photoresist film 13 being a mask, the silicon oxide film 12 is dry-etched. It should be noted that since the second embodiment is applied, the bow of the silicon substrate 11 is recognized (the step S1) and a condition according to that range is set prior to start of dry etching. Then, dry etching is performed under this condition (the step S2).

Then, the photoresist film 13 is removed.

Incidentally, though the silicon oxide film 12 is formed directly on the silicon substrate 11 in this description, a position in which the silicon oxide film 12 is formed is not limited. For example, the silicon oxide film 12 may be formed as an interlayer insulating film and a contact hole or via hole may be formed by dry etching in the silicon oxide film 12. The second embodiment of the present invention can also be applied to a processing of a polycrystalline silicon film or the like constituting a gate electrode, in addition to the silicon oxide film 12. Further, the second embodiment of the present invention can also be applied to a processing of an Al film or the like constituting a wiring. Meanwhile, when an element isolation region is formed by adopting an STI (Shallow Trench Isolation) method, a trench is formed in the semiconductor substrate. The second embodiment of the present invention can also be applied to formation of the trench.

The kind of substrate to which the present embodiment is applicable is not specifically limited, and the present invention is applicable to any of a substrate created by a CZ method, an annealed substrate, or an epitaxial substrate. Additionally, as a substrate, a compound semiconductor substrate or the like may be used in addition to the silicon substrate. Further, a diameter of the substrate is not specifically limited.

According to the present invention, dry etching can be carried out under an appropriate condition according to a bow. Therefore, it is possible that in-plane uniformity of dry etching is enhanced to restrain variety of etching speed in the substrate and to reduce an etching shift. As a consequence, it is possible to manufacture a semiconductor device with an appropriate characteristic in a high yield.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

What is claimed is:

1. A manufacturing method of a semiconductor device, comprising the steps of:
   recognizing a bow of a semiconductor substrate;
   acquiring an etching condition corresponding to the bow of the semiconductor device from etching conditions set in advance according to each bow; and
   performing dry-etching of the semiconductor substrate under the etching condition acquired in said acquiring the etching condition,
   wherein the etching condition includes a condition in which a gas cooling pressure of a center portion of the semiconductor substrate is higher than a gas cooling pressure of an outer peripheral portion, as a condition for a semiconductor substrate whose bow is "0" or more.

2. The manufacturing method of a semiconductor device according to claim 1, further comprising:
   acquiring information of the bow attached to the semiconductor substrate as shape information of the semiconductor substrate.

3. The manufacturing method of a semiconductor device according to claim 2, further comprising:
   accepting semiconductor substrates whose bows are in a predetermined range,
   wherein the range of the bow is recognized when recognizing the bow.

4. The manufacturing method of a semiconductor device according to claim 2, further comprising:
   measuring the bow of the semiconductor substrate.

5. The manufacturing method of a semiconductor device according to claim 1, wherein the etching condition is set separately for the condition for the bow of "0" or more and for the condition for the bow of less than "0".

6. The manufacturing method of a semiconductor device according to claim 1, further comprising:
   accepting semiconductor substrates;
   measuring the bows of the semiconductor substrates; and
   sorting the semiconductor substrates by checking the bows of the semiconductor substrates against a standard set in advance.

7. The manufacturing method of a semiconductor device according to claim 1, wherein the etching conditions are ones different in pressure of cooling gas supplied into a chamber based on the bow.

8. A manufacturing method of a semiconductor device, comprising:
   recognizing a bow of a semiconductor substrate;
   acquiring an etching condition corresponding to the bow of the semiconductor device from etching conditions set in advance according to each bow; and
   performing dry-etching of the semiconductor substrate under the etching condition acquired in said acquiring the etching condition,
   wherein the etching conditions include a condition in which a gas cooling pressure of an outer peripheral portion of the semiconductor substrate is higher than a gas cooling pressure of a center portion, as a condition for a semiconductor substrate whose bow is less than "0".

9. The manufacturing method of a semiconductor device according to claim 8, further comprising:
   acquiring information of the bow attached to the semiconductor substrate as shape information of the semiconductor substrate.

10. The manufacturing method of a semiconductor device according to claim 8, further comprising:
    accepting semiconductor substrates whose bows are in a predetermined range,
    wherein the range of the bow is recognized when recognizing the bow.

11. The manufacturing method of a semiconductor device according to claim 8, further comprising:
    measuring the bow of the semiconductor substrate.

12. The manufacturing method of a semiconductor device according to claim 8, wherein the etching condition is set separately for the condition for the bow of "0" or more and for the condition for the bow of less than "0".

13. The manufacturing method of a semiconductor device according to claim 8, further comprising:
    accepting semiconductor substrates;
    measuring the bows of the semiconductor substrates; and
    sorting the semiconductor substrates by checking the bows of the semiconductor substrates against a standard set in advance.

14. The manufacturing method of a semiconductor device according to claim 8,
    wherein the etching conditions are ones different in pressure of cooling gas supplied into a chamber based on the bow.

* * * * *